United States Patent [19]
Soler et al.

[11] Patent Number: 5,684,340
[45] Date of Patent: Nov. 4, 1997

[54] ARRANGEMENT FOR PREVENTING ELECTROMAGNETIC INTERFERENCE

[75] Inventors: Xavier Soler; Richard Lewis; Andrew M. Frost, all of Barcelona, Spain; Robert F. German, Boulder, Colo.

[73] Assignee: Hewlett-Packard Company, Palo Alto, Calif.

[21] Appl. No.: 602,404

[22] Filed: Feb. 16, 1996

[30] Foreign Application Priority Data

Feb. 24, 1995 [EP] European Pat. Off. ............... 95500019
Jul. 5, 1995 [EP] European Pat. Off. ............... 95500098

[51] Int. Cl.$^6$ ..................................................... H05K 9/00
[52] U.S. Cl. ............................. 307/91; 361/818; 439/607
[58] Field of Search ........................... 307/89–91, 106; 361/816, 818, 159; 174/35 R, 35 MS, 51; 333/12; 315/85; 439/607–610; 336/84 R, 84 M

[56] References Cited

U.S. PATENT DOCUMENTS

| | | | |
|---|---|---|---|
| 4,945,323 | 7/1990 | Gerstenberg et al. | 333/12 |
| 5,428,508 | 6/1995 | Pronto | 361/818 |
| 5,448,445 | 9/1995 | Yamate et al. | 361/304 |
| 5,504,659 | 4/1996 | Acatay et al. | 361/816 |
| 5,528,465 | 6/1996 | Yamate et al. | 361/818 |

Primary Examiner—Richard T. Elms

[57] ABSTRACT

An arrangement for preventing electromagnetic interference is aimed at attenuating electromagnetic emissions in electronic apparatus, especially those having a printed circuit board, a conductive enclosure, and requiring external connections to other devices. The arrangement comprises a division of the printed circuit board into two zones, a first zone having sources of unwanted electromagnetic energy, and a second zone which is electrically connected with the first zone via conductors which allows the second zone to connect to other devices. Filtering devices are incorporated into the printed circuit board and, in conjunction with integrated conducting zones, provide suitable connections to a metallic protecting enclosure in order to remove or to attenuate unwanted signal components from the signals being transmitted from the first zone to the second zone via the conductors. The protecting enclosure components enclose at least portions of the first zone of the printed circuit board for shielding direct electromagnetic emissions originating from the first zone.

7 Claims, 6 Drawing Sheets

ARRANGEMENT FOR PREVENTING ELECTROMAGNETIC INTERFERENCE

FIELD OF THE INVENTION

This invention relates to a new device for the prevention of electromagnetic interference.

BACKGROUND OF THE INVENTION

As is known, many pieces of electronic equipment generate electromagnetic interference (or noise) which can cause interference with certain parts of the same equipment or with other electronic units located near the equipment. On the other hand, attenuation of electromagnetic energy emitted by electronic apparatus is already regulated by law in some countries and is about to be in the near future throughout the E.U. In order to reduce the effects of interference or level of emissions, many types of metallic screens or shields and protective devices have been devised which are usually interposed between the point or points from which the electromagnetic radiation radiates and the circuits which may be affected by interference caused by the radiation.

Among the technical measures used to avoid interference, one which has been widely practiced is the use of a metallic or electrically conductive enveloping enclosure, i.e. an electromagnetic protective shield which accommodates the entire system in its interior and prevents the transmission of electromagnetic radiation or prevents electromagnetic radiation from other sources from penetrating into the protected space.

In the event conductors are required which penetrate the enclosure or if there is mechanical interaction with the outside via motors, keyboards, etc., the solution of just enveloping the unit or protecting it by means of an electromagnetic protecting enclosure is often inadequate, because of the degradation of the electromagnetic shielding caused by openings and, more critically, conducting cables and elements that act as radiators. The solutions generally followed are: 1) for openings: to reduce as far as possible their dimensions, 2) for the cables: filtering measures are needed.

In some cases, use is made of special connectors provided with protection and filtering systems, but these are expensive and constitute an inflexible mechanical solution. They work well where they have become the standard, for example as I/O connectors for computers and peripherals, but are extremely expensive and inflexible for internal device connections. In other cases, use is also made of ferrites fitted to the conductors outside the enclosure. This arrangement is also expensive, difficult to assemble and adds complexity.

In view of the technical problems described above and the present state of the art, an object of the present invention is to achieve a satisfactory solution to the problem of attenuation of electromagnetic interference, using a system which has the benefits of low cost components, simplified assembly and flexible arrangement options that can be applied in a systematic and reliable way to all products having the aforementioned needs. It is particularly applicable to machines such as plotters which are relatively large and therefore generally need long conductors. However, it is equally applicable to small products in which cost can be saved by using smaller shielding enclosures.

SUMMARY OF THE INVENTION

Required filtering components for input/output conductors are arranged on a printed circuit board inside an electromagnetic protecting enclosure. The conductors pass through the walls of the electromagnetic protecting enclosure via small apertures or windows which also allow passage of a part of the printed circuit board outside of the enclosure so that connections may be arranged outside the protective enclosure. The printed circuit board is therefore divided into two distinct zones, the first zone of which carries electronic parts and is protected by means of the electromagnetic protecting enclosure, while the other zone is outside the enveloping protective enclosure and includes input/output connections.

To achieve good contact between the circuit board and the enclosure, the present invention envisages the arrangement of conducting zones, (i.e., surface conductors) normally made of tinned copper, which are arranged on one, or preferably both, faces of the printed circuit board, respectively, and interact with a conductive joint that provides good electrical contact with the protective enclosure. According to one preferred embodiment, which is favored for mechanical tolerance reasons, a flexible conductive joint is preferred, although a direct rigid connection may be used.

Filtering of undesired high frequency noise can be achieved by use of standard or conventional components mounted, as normal, on the circuit board, and which connect to the aforementioned conducting zones to achieve a return path required by such filters.

By these means, electromagnetic shielding for both conducted and radiated emissions, can be provided for the "noisy" side of the circuit board by allowing the circuit board to pass through a mechanically simple slot or slots, while maintaining all the benefits of standard and cheap components and easy assembly/disassembly.

A preferred practical embodiment envisages the mounting of the printed circuit unit on the lower half of the protective envelope, the upper part of the protective envelope then being attached in the manner of a sandwich comprising the lower metal part of the enclosure, the printed circuit unit and the upper part of the protective metal enclosure. The input/output connectors remain outside the envelope and allow connection of the input/output cables via inexpensive connector components.

Therefore, the invention comprises an arrangement of components that provides an electromagnetic filter, for a Faraday cage type of shield; that allows signal or power conductors to pass without compromising shielding effectiveness; and enables use of standard, cheap and easily assembled parts. According to one embodiment, the present invention provides that:

a) The enveloping enclosure providing protection against electromagnetic interference has an aperture or apertures to permit the passage of a part or parts of the printed circuit board outside of the enclosure. The aperture or apertures include electrically conductive joints for establishing contact to one or both of the upper and lower faces of the printed circuit board;

b) The printed circuit board is made up of two distinct zones:
   a first zone having sources of unwanted electromagnetic emissions, and
   a second zone which is electrically connected with the first area via conductors, which allow suitable connection to other devices.

c) The shielding means enclose at least portions of the first zone of the printed circuit board for shielding direct electromagnetic emissions originating from the first zone, and d) filtering means incorporated into the printed circuit board and coupled to the shielding means are provided for removing or attenuating unwanted signal components from the signals being transmitted from the first zone to the second zone via the conductors.

e) Means are arranged to provide a good high frequency electrical connection between the filtering system and the protective enclosure.

The present invention also envisages an arrangement of a number of transverse conducting elements which provide communication between upper and lower conductive zones associated with the printed circuit board which, in turn, connect to the enclosure. The transverse conducting elements provide, in conjunction with the corresponding upper and lower conducting zones, a number of transverse windows of reduced dimension which enable passage of the input/output conductors from the inner precinct, protected by the enveloping enclosure, to the outer precinct.

The present invention also provides for a second embodiment in which connections are disposed in an intermediate zone on the panel or printed circuit. In this version, which may be more advantageous for a number of specific types of electronic apparatus, a series of intermediate zones on the printed circuit board (wherein connections are made and which will be separated or isolated electromagnetically from the rest of the printed circuit board) are separated by means of an arrangement of conductive pathways between the edges of the enveloping enclosure. Each pathway comprises laminar contact elements disposed on the upper and lower parts of the printed circuit board and a transverse interconnecting element through the printed circuit board. This second embodiment may, like the preferred version, utilize the upper and lower faces of the printed circuit board, or only one side of the board, corresponding to the one on which the connections are made. In both above versions, the protective enclosure can also be incorporated with the board itself, if needed.

According to another embodiment of the invention, the same principles and means for attenuation of electromagnetic interference disclosed above may be used to protect components on the printed circuit board from disturbances entering from the outside via interconnecting conductors. That is, the reverse of the foregoing teaching in which the filtering means are arranged to avoid the electromagnetic disturbances generated by the elements on the printed circuit board and within the enclosure from being transmitted via the conductors passing through the enclosure to the external connectors.

The invention is also applicable to the case in which it is desired to separate the elements of a printed circuit board into two sections, one containing more delicate components and being electromagnetically protected from the other section of the circuit board or "dirty" section by the same arrangements as for separating the two previously explained zones.

BRIEF DESCRIPTION OF THE DRAWINGS

Some preferred embodiments of the present invention will be described below by way of non-limitative examples and with reference to the accompanying drawings.

DETAILED DESCRIPTION OF PREFERRED EMBODIMENTS

Figure 1:
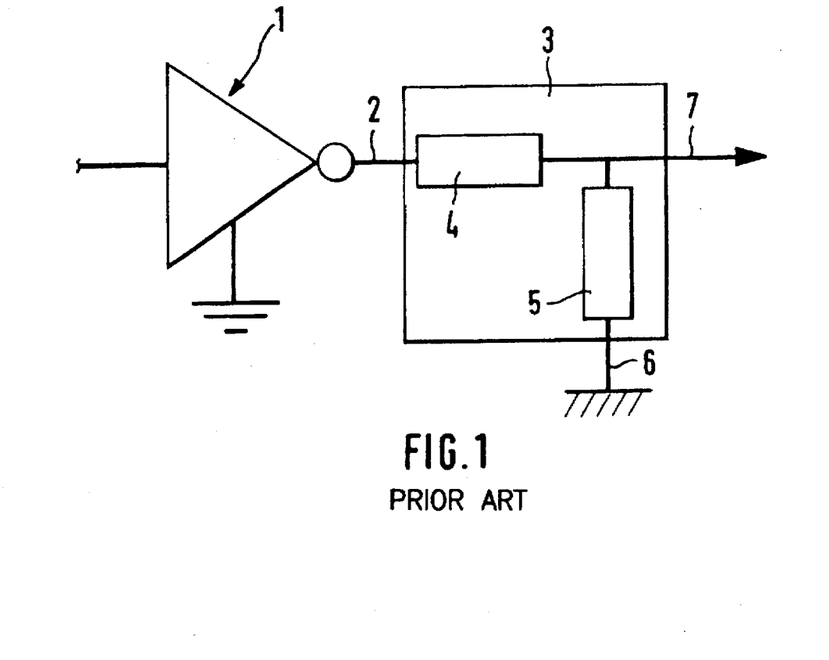
FIG. 1 shows, in diagrammatic form, a filter for high frequency signals.

In a conventional system, as illustrated diagrammatically in FIG. 1, an electronic device -1- includes an input/output conductor -2- which has a filter -3- for electromagnetic noise attenuation. Filter -3- comprises conventional components, which are diagrammatically illustrated by numerals -4- and -5- and a connection -6- which provides a high-frequency, low impedance return path to the enclosure. The output -7- will receive a connection (not illustrated).

The invention is intended to achieve both simple and economic protection of printed circuits against high frequency electromagnetic interference. To that end, as illustrated diagrammatically in FIGS. 2 and 3 and according to a first embodiment, part of a printed circuit board -8- is fully or partially contained inside two electromagnetic protecting enclosure components -9- and -10- which are electrically conductive and which sandwich circuit board -8-. Components -9- and -10- enclose all the electronic components of the printed circuit. The printed circuit board includes a part -8'- which is arranged on the outside of the enveloping enclosure -9- and -10-, and which includes a zone for engaging connectors -11-.

Figure 2:
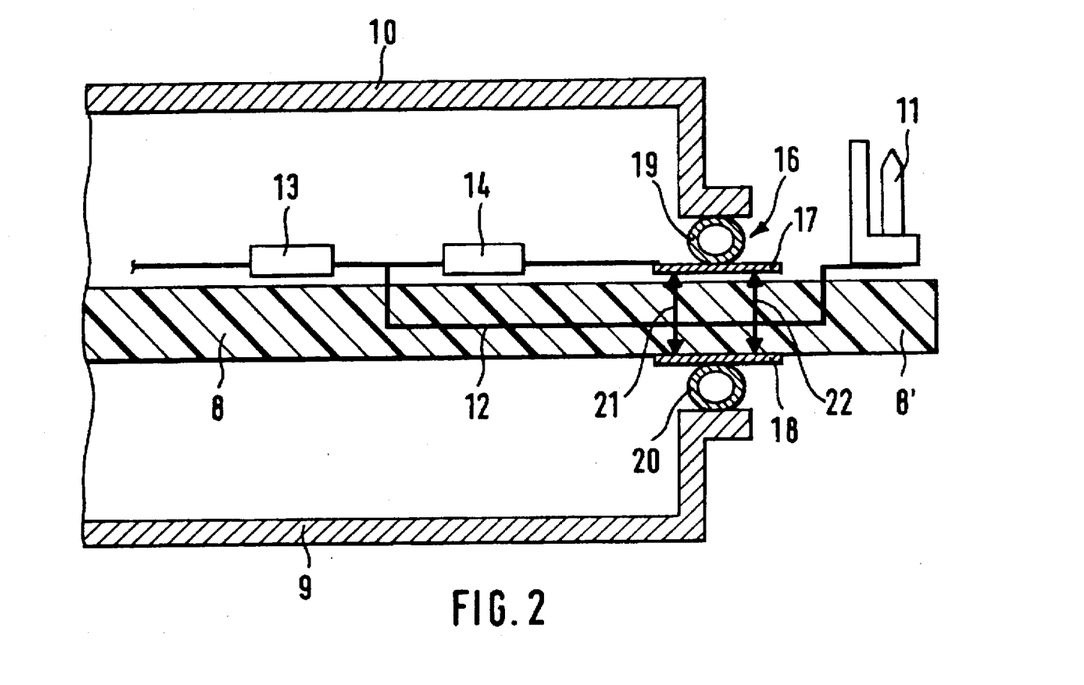
FIGS. 2 and 3 show, respectively, a longitudinal section and a transverse section, both diagrammatic, through an embodiment of a device according to the present Invention.
Figure 3:
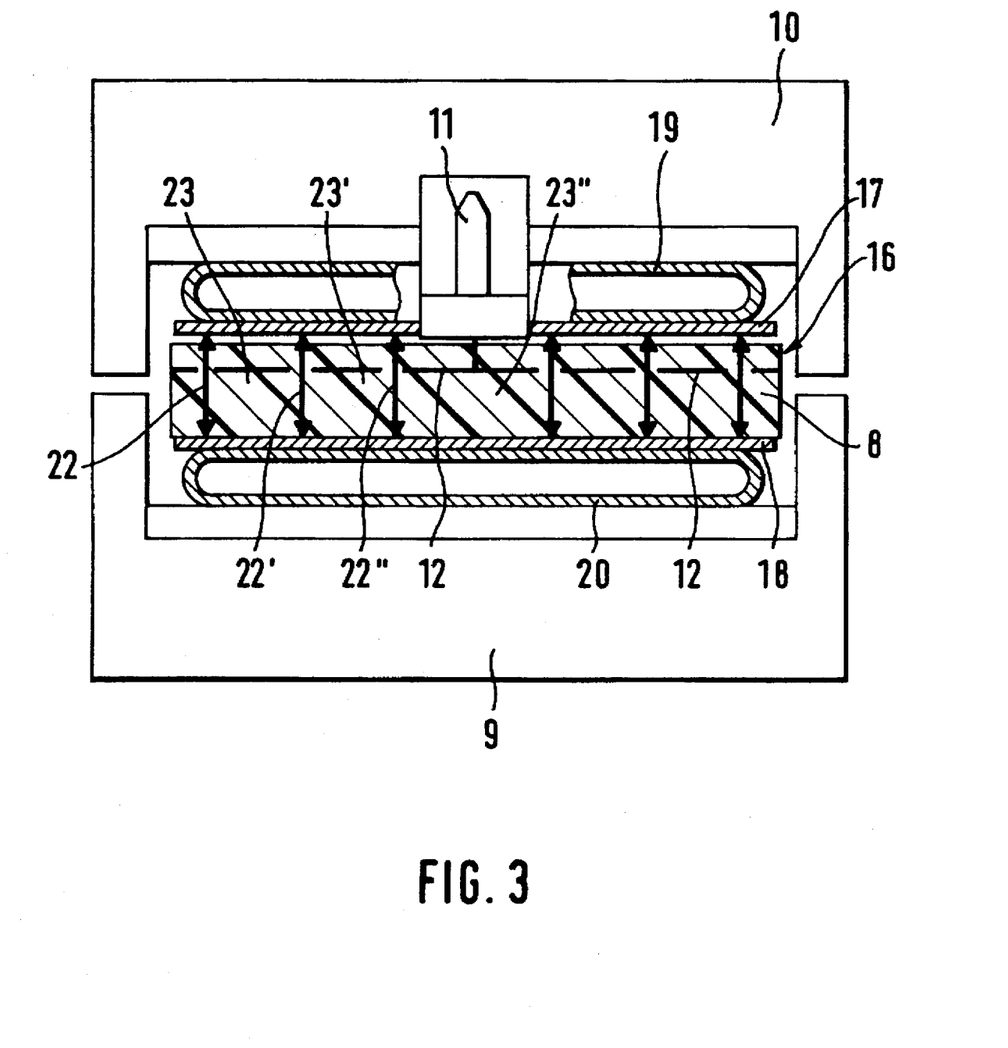

According to the present invention, the filtering of the conductors, for example conductor -12-, is carried out inside the enveloping electromagnetic protecting enclosure -9- and -10-, by electronic filtering elements -13- and -14-.

Even though reference is made herein to connectors -11-, which are then connected to other devices by cables, the invention also encompasses any other form of connection to these same devices, such as for example direct assembly on the same printed circuit board portion -8'-.

According to the present invention, between components -9- and -10- which make up the outer protective enclosure, a longitudinal opening -16- is formed through which the printed circuit board passes. The printed circuit board includes top and bottom conductive zones -17- and -18- which are comprised of, for example, copper or other suitable metal. According to this embodiment, conductive joints, such as -19- and -20-, make contact, respectively, with upper and lower conducting zones -17- and -18- and the edges of the enveloping enclosure.

Disposed between upper and lower conductive zones -17- and -18-, are a number of interconnecting through conductors -21- and -22-, arranged as illustrated in FIG. 2, which pass through the printed circuit board. FIG. 3 illustrates through conductors -22-, -22'-, -22"-, ..., which are variable in number and determine intermediate transverse "windows" -23-, -23'-, -23"-, ..., through which conductors 12, originating from the internal zone of the printed circuit and from the filtering systems, pass. Conductors -12- (see FIG. 2) connect to contacts -11- that are arranged on the outside of enveloping enclosure -9- and -10-.

Figure 4:
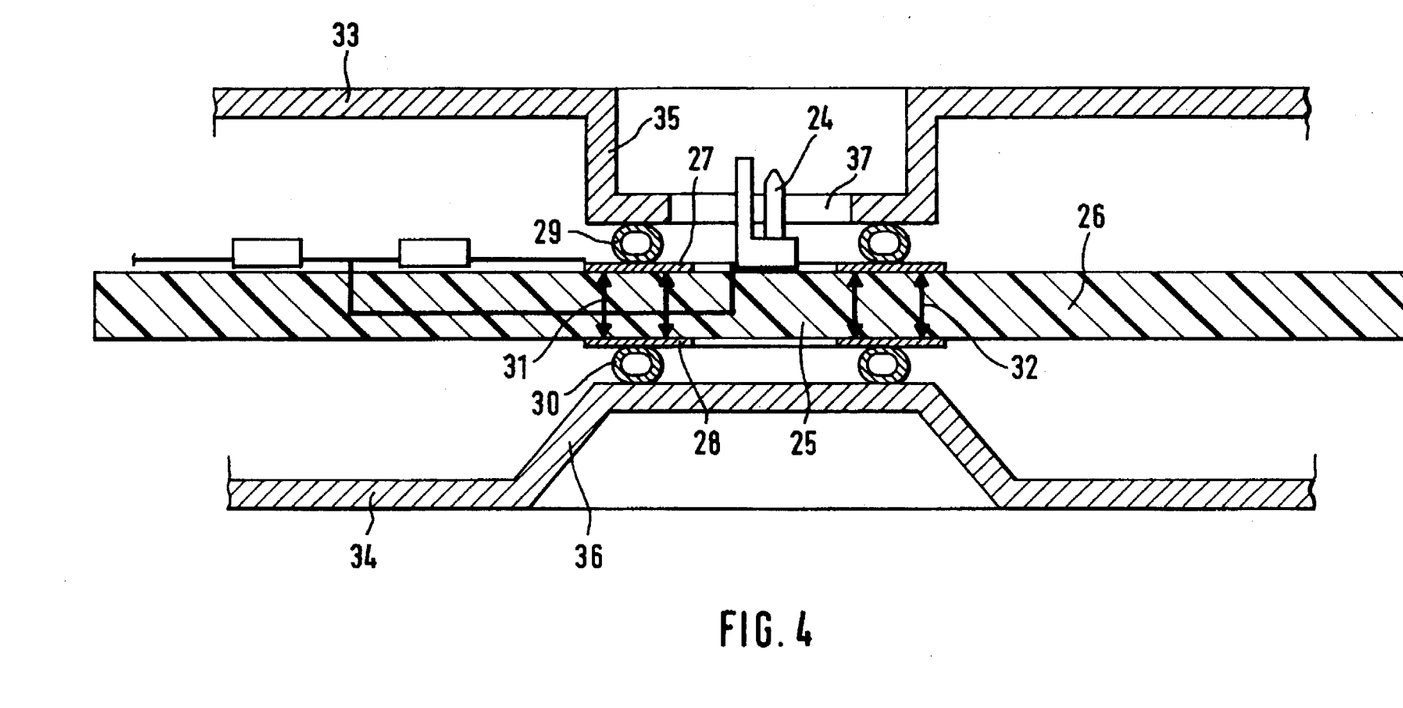
FIG. 4 is a transverse section through a second embodiment of the present invention with 360° protection and cable filtering, and with the connectors disposed in an intermediate zone on the printed circuit.

In a second embodiment of the invention shown in FIG. 4, connectors -24- are disposed in an intermediate zone -25- on the printed circuit board (PCB) -26-, which permits better adaptation to certain types of apparatus. In this case, the electromagnetic isolation of intermediate zone -25- is effected by means of upper and lower conducting areas -27- and -28-, which assume the form of closed loops on each face of the printed circuit board -25- and receive individual conductive joints -29- and -30- (similar to those described above). Conducting areas -27- and -28- are interconnected by through conductors -31- and -32- in a similar manner to that described above.

In FIG. 4, upper wall -33- and lower wall -34- make up the enveloping enclosure of the electronic apparatus and include individual inset portions or concave zones -35- and -36- which properly position joints -29- and -30-. The bottom of concave zone -35- includes an aperture -37- intended for the passage of connectors.

Figure 5:
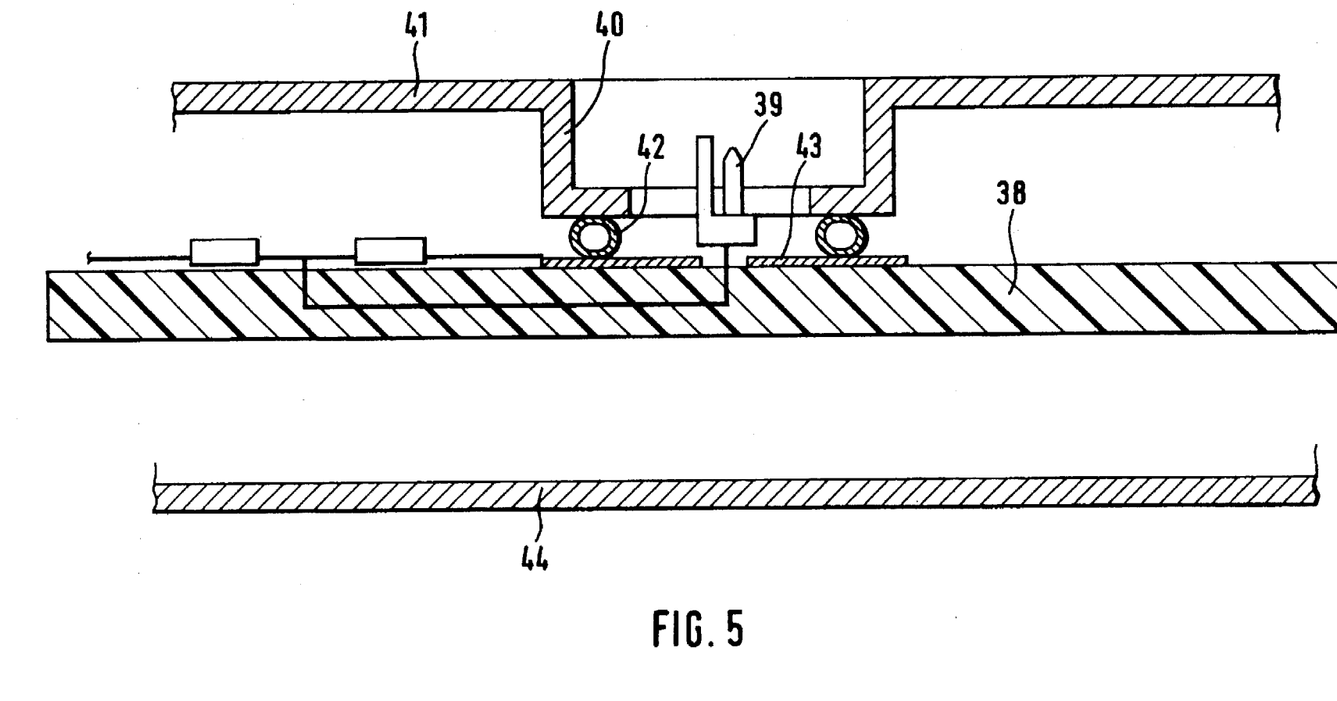
FIG. 5 shows a third embodiment, similar to that in FIG. 4, but without any contact between the lower part of the enclosure and the underside of the circuit board.

This constructional variant also may be achieved as shown in FIG. 5, in which can be seen elements equivalent to those in FIG. 4, on the upper surface of PCB 38. A connector -39- is located in the bottom of a concavity -40- in upper conductive wall -41-. A single conductive joint -42- contacts a single contact part -43- on the upper face of PCB -38-. In this case, there is no need for contact to lower wall -44- because the electromagnetic shield function performed by the ring of vertical conductors plus the upper surface of lower wall -44- is here performed by a metal screen on the top face of the PCB. Another intermediate solution between these two is a metal screen on the bottom of the PCB, connected by a ring of vertical conductors.

Figure 6:
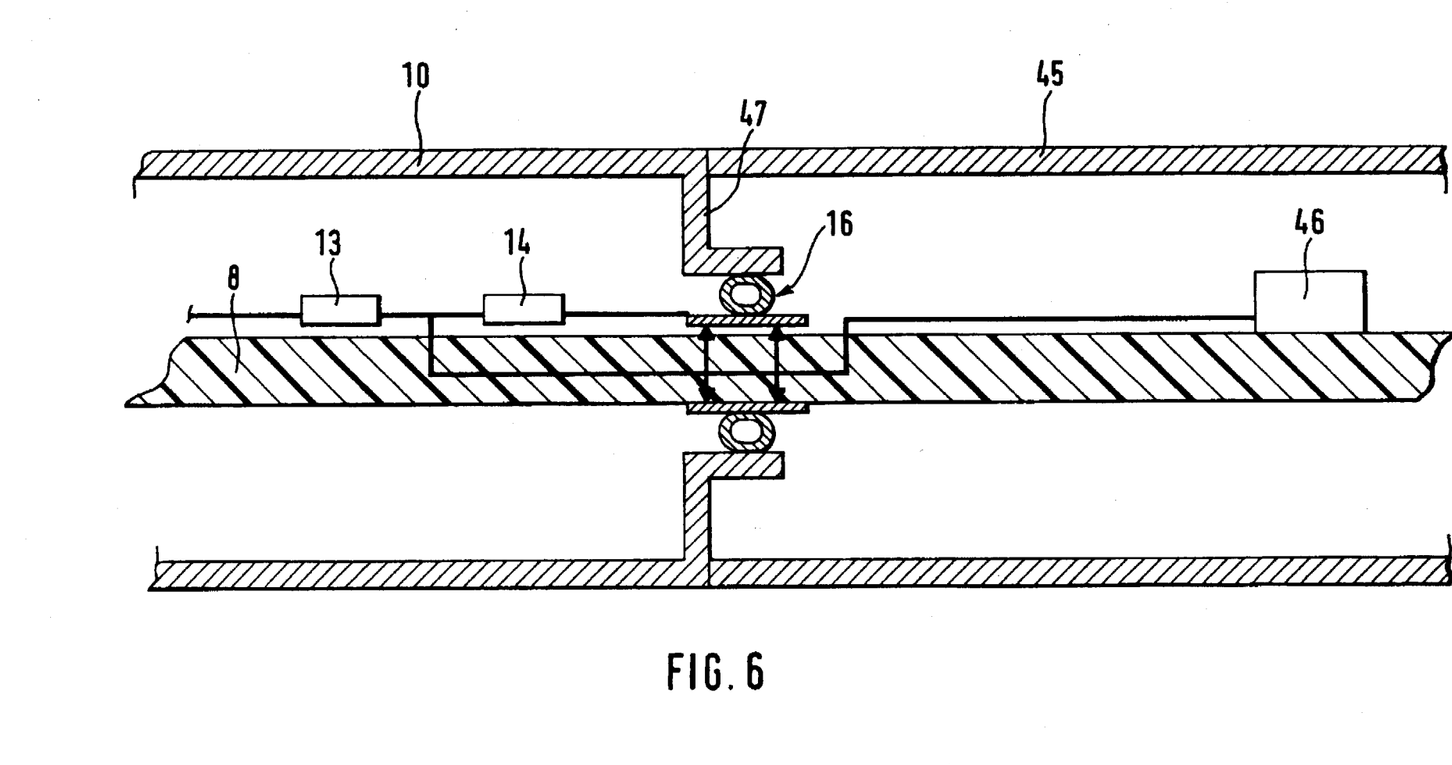
FIG. 6 illustrates a cross section of an embodiment in which parts of the circuit board are separated within the same enclosure.

The invention is also applicable to the case in which it is desired to separate the elements of a printed circuit board into two sections, one section containing more delicate components and being electromagnetically protected from the other "noisy" section by the same arrangements as for separating the two previously explained zones -8- and -8'-. This embodiment, which is shown in FIG. 6, features a second enveloping enclosure -45- which eventually may be a part of the enveloping enclosure -10- for section -8-. The second enveloping enclosure protects components -46- of the printed circuit board from the "noisy" section of components contained in zone -8-. The filtering means represented by the same references -13- and -14- as above explained, protect components -46- from emissions coming from the "noisy" section. In the case that the enveloping enclosure is the same for both parts of the circuit board, there will be an internal wall -47- in the common enclosure through which the circuit board will pass, with the same closing and contact arrangements as explained for FIGS. 1–5.

Figure 7:
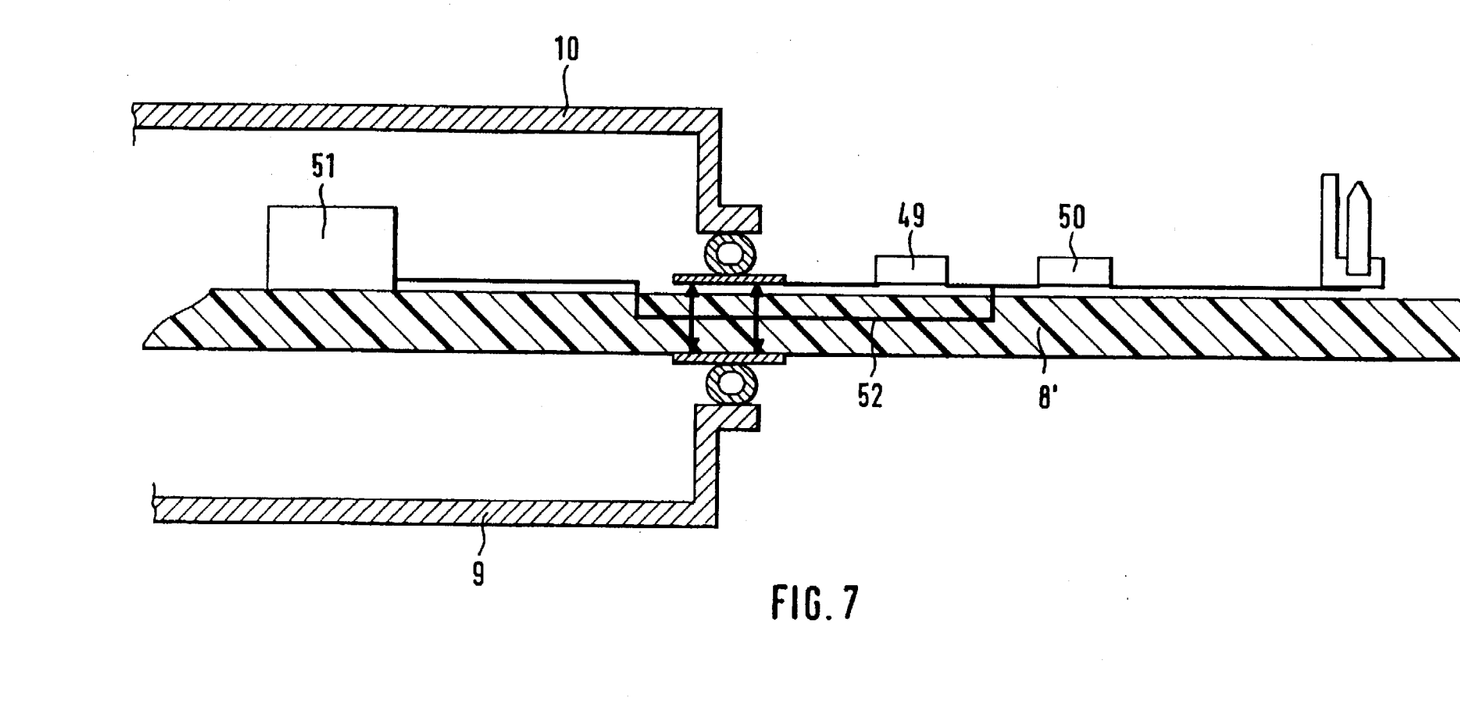
FIG. 7 shows the arrangement of the filtering means for protecting the circuit board from external electromagnetic disturbances.

According to another embodiment of the invention, the same principles and means for attenuation of electromagnetic interference which have been disclosed above may be used for protection of components on the PCB from disturbances entering from the outside, through the conductors. That is, the reverse of the foregoing teaching in which the filtering means were arranged to avoid the electromagnetic disturbances generated by the elements on the printed circuit board within the enclosure from being transmitted via the conductors passing through the enclosure to external connectors. In this case, which is shown in FIG. 7, filtering means -49- and -50- are arranged on external part -8'- of the PCB, thus protecting electronic devices -51- inside of enclosure -9-, -10- against electromagnetic disturbances which might be channelled by conductors -52- from the outside to the internal elements contained within enclosure -9-, -10-.

By means of these arrangements, a number of advantages of both a functional and economical type are achieved. The following, in particular, can be stated:

The enveloping electromagnetic protecting enclosure is effectively continuous, including the apertures which pass the conductors to the outside.

The connections made to output parts on the upper and lower surfaces of the printed circuit have the benefit of a number of easily designed implementations.

The connections are arranged outside the protective enclosure and allow flexibility of design, facilitate the changing of connectors used and are also remarkably simple and easy to manufacture and assemble.

The arrangement also makes it possible to achieve the separation of two clearly differentiated zones of the same PCB, one of them being an electromagnetically noisy or dirty zone, situated inside a protective enclosure, and the other, which is electromagnetically quiet or clean, being the one which corresponds to that part of the printed circuit which is located outside the electromagnetic protecting enclosure.

There are greater possibilities for the design of the printed circuit, incorporating the appropriate filters and using more types of commercially available connectors or parts.

An additional sealing function can be obtained by the use of suitable commercially available gaskets which provide a sealing function in addition to electrical contact.

There is the establishing of an effective system of "small windows" through which the conductors pass with 360° protection and with the possibility of producing the apertures with reduced dimensions, thereby achieving a high degree of protection against the passage of electromagnetic radiation.

As will be realized, the foregoing description of a preferred example of embodiment of the present invention is not limitative as regards the scope of the present invention, so persons skilled in the art will be able to introduce a large number of variations which will still be included within the scope of the following claims.

We claim:

1. An arrangement for preventing electromagnetic interference in electronic apparatus, the arrangement comprising:
   (a) a printed circuit board including two types of zones:
      a first type of zone having sources of high frequency energy, said first type of zone located within an electrically conductive enveloping enclosure designed to inhibit or attenuate direct electromagnetic radiation, and
      a second type of zone which is electrically connected to the first type of zone via conductors, and not contained within a same enclosure or part of an enclosure containing the first type of zone, said second type of zone enabling connection to other devices,
   (b) filter means incorporated on the printed circuit board, for removing or attenuating unwanted high-frequency energy from the conductors for interconnecting the first type of zone and second type of zone, and
   (c) a high frequency electrical connection between the filter means and the enclosure, arranged at a boundary or boundaries of the first type of zone and second type of zone of the printed circuit board, said high frequency electrical connection including conductive zones positioned above and below opposed regions of the printed circuit board at a boundary between the first type of zone and second type of zone, said conductive zones electrically interconnected to one another by means of transverse conducting elements through said printed circuit board.

2. An arrangement according to claim 1, wherein the second type zone is located outside of the enclosure.

3. An arrangement according to claim 1, wherein mechanical and electrical contact between the enclosure and the conductive zones is made via flexible conductive means.

4. An arrangement according to claim 1, wherein the second type zone or zones are determined by portions of the printed circuit board which protrude through the enclosure.

5. An arrangement according to claim 1, in which a second type of zone is determined by intermediate portions of the printed circuit board which are accessible through apertures formed in the enclosure.

6. An arrangement according to claim 1, wherein the second type of zone of the printed circuit board is located within an electrically enveloping enclosure.

7. An arrangement according to claim 6, wherein the electrically enveloping enclosure for the second type of zone is a same enclosure as for the first type of zone.

* * * * *